United States Patent [19]

Kaimasu et al.

[11] Patent Number: 4,994,329
[45] Date of Patent: Feb. 19, 1991

[54] ARTICLE HAVING NICKEL PLATED FILM COMPRISING A VARYING CONTENT OF PHOSPHORUS

[75] Inventors: Taketoshi Kaimasu; Takayoshi Tsuzuki, both of Toyota, Japan

[73] Assignee: Aisin Seiki Kabushiki Kaisha, Kariya, Japan

[21] Appl. No.: 436,647

[22] Filed: Nov. 15, 1989

[30] Foreign Application Priority Data

Nov. 15, 1988 [JP] Japan .................. 63-288480
Nov. 24, 1988 [JP] Japan .................. 63-296586

[51] Int. Cl.$^5$ .................. C25D 3/56; C25D 5/14; C25D 5/12; B32B 15/01
[52] U.S. Cl. .................. 428/678; 204/38.4; 204/44.7; 428/680
[58] Field of Search .................. 204/38.4, 44.7; 428/678, 680

[56] References Cited

U.S. PATENT DOCUMENTS 3,264,199 8/1966 Fassell et al. .................. 204/44.7 X
4,581,109 4/1986 Goor et al. .................. 204/38.4 X

FOREIGN PATENT DOCUMENTS

60-248882 12/1985 Japan .

Primary Examiner—G. L. Kaplan
Attorney, Agent, or Firm—Banner, Birch, McKie, & Beckett

[57] ABSTRACT

A process of nickel plating for forming a plated film having a high phosphorus content according to this invention comprises the steps of: a first step of electroless plating a substance to be plated in an electroless plating bath capable of forming an electroless plated film having a phosphorus content of from 0.20 to 0.25 in atomic ratio of phosphorus with respect to nickel taken as one (1); and a second step of electroplating the substance to be plated by applying an electric current having an electric current density of from 1 to 10 A/dm$^2$, and the substance to be plated being left immersed in the electroless plating bath continuously, thereby laminating an electroplated film on the surface of the electroless plated film. The process of nickel plating can form a plated film having a remarkably improved wettability with respect to solders since the electroplated film is formed on the electroless plated film having the high phosphorus content. Further, the plated film maintains the good chemical resistance and abrasion resistance of the electroless plated film, and has strong adhesion endurable to the thermal stress and the mechanical stress of an actual service.

3 Claims, 5 Drawing Sheets

ARTICLE HAVING NICKEL PLATED FILM COMPRISING A VARYING CONTENT OF PHOSPHORUS

BACKGROUND OF THE INVENTION

1. Field of the Invention

This invention relates to a process of nickel plating for forming a plated film having a high phosphorus content, and is applicable to an electrical contact having a sliding portion, an electrical part having a printed circuit board and a soldered portion, and a part for wiring.

2. Description of the Related Art

Japanese Unexamined Patent Publication (KOKAI) No. 248882/1985 discloses a technique relating to this invention. The publication sets forth an electroless plating bath capable of forming an electroless nickel plated film having a high phosphorus content of from 0.20 to 0.25 in atomic ratio of phosphorus with respect to nickel taken as one (1). An electroless plated film formed by using the electroless plating bath has a high phosphorus content of from 0.20 to 0.25 in atomic ratio of phosphorus with respect to nickel taken as one (1), and is superior in chemical resistance and abrasion resistence.

A problem arises, however, in that the electroless plated film formed by using the electroless plating bath cannot be applied to electrical parts having a sliding portion, such as electrical contacts. This is part of the sliding portion should always be subjected to a subsequent soldering process and because the electroless plated film is inferior in wettability with respect to solders.

SUMMARY OF THE INVENTION

It is therefore an object of this invention to provide a process of nickel plating for forming a plated film having a high phosphorus content as well as a superior wettability with respect to solders.

It is another object of this invention to provide a process of nickel plating for forming a plated film having a high phosphorus content and comprising an electroless plated film and an electroplated film, wherein an excellent adhesion is given at the boundary between the electroless plated film and the electroplated film.

A process of nickel plating for forming a plated film having a high phosphorus content according to this invention comprises the steps of: a first step of electroless plating a substance to be plated in an electroless plating bath capable of forming an electroless plated film having a phosphorus content of from 0.20 to 0.25 in atomic ratio of phosphorus with respect to nickel taken as one (1); and a second step of electroplating the substance to be plated by applying an electric current having an electric current density of from 1 to 10 A/dm$^2$, and the substance to be plated being left immersed in the electroless plating bath continuously, thereby laminating an electroplated film on the surface of the electroless plated film. The second step of electroplating is preferred to last for 1 to 10 minutes or less. When the second step lasts for less than 1 minute, no electroplated film having a sufficient wettability with respect to solders can be formed. When the second step lasts for more than 10 minutes, an electroplated film having an excessive thickness is formed, and the electroplated film is likely to strain and come off. The electric current density is maintained at 10 A/dm$^2$ or less in the second step of electroplating according to this invention, thereby preventing the electroplated film from burning.

Since the electroplated film is formed on the electroless plated film having good chemical resistance and abrasion resistance and the phosphorus content of the electroplated film is forcibly decreased gradually, the plated film formed by the process according to this invention has a remarkably improved wettability with respect to solders.

In the process according to this invention, the electroless plating and the electroplating proceed in accordance with the following reaction formulas:

$$Ni^{2+} \rightarrow Ni^0 - 2e- \quad (1)$$

$$3PO_2^{2-} \rightarrow P^0 + 2PO_3^{2-} + 2e- \quad (2)$$

The nickel deposition depends on the electric current density in the reaction formula (1). On the contrary, the phosphorus deposition is substantially independent of the electric current density in the reaction formula (2). Accordingly, it is possible to control the phosphorus content of the electroplated film by varying the electric current density in the second step of the electroplating of the process according to this invention.

Further, the electric current density may be increased continuously from a first predetermined value falling in the range of 0 to 10 A/dm$^2$ to a second predetermined value being 10 A/dm$^2$ or less. When such an operation is performed, the phosphorus content difference at the boundary between the electroless plated film and the electroplated film can be eliminated. Thus, the physical property difference at the boundary between the electroless plated film and the electroplated film becomes unrecognizable, and the boundary between the electroless plated film and the electroplated film becomes unrecognizable. As a result, no electroplated film comes off when thermal shock or mechanical stress is applied, and no electroplated film comes off together with the electroless plated film even after soldering.

The electric current density may be varied to control the phosphorus content in the electroplated film at a predetermined value.

Thus, the process of nickel plating for forming a plated film having a high phosphorus content according to this invention can form the plated film comprising the electroless plated film and the electroplated film and having a remarkably improved wettability with respect to solders. This advantage is effected by the arrangement of the plated film, in which the phosphorus content is decreased toward the vicinity of the surface of the electroplated film, at which the electroplated film is to be made into an alloy film together with solders. Further, the plated film has strong adhesion endurable to the thermal stress and the mechanical stress of an actual service. The plated film is accordingly applicable to a soldering process automated with a robot and the like.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 (a) is a schematic illustration of an electric contact having a sliding portion;

FIG. 1 (b) is a schematic sectional view of a major portion thereof;

FIG. 2 (a) is a schematic illustration showing a step of a process of nickel plating for forming a plated film having a high phosphorus content according to this invention;

FIG. 2 (b) is another schematic illustration showing a step of a process of nickel plating for forming a plated film having a high phosphorus content according to this invention;

FIG. 2 (c) is still another schematic illustration showing a step of a process of nickel plating for forming a plated film having a high phosphorus content according to this invention;

DESCRIPTION OF THE PREFERRED EMBODIMENTS OF THE INVENTION

Having generally described this invention, a further understanding can be obtained by reference to certain specific preferred embodiments which are provided herein for purposes of illustration only and are not intended to be limiting unless otherwise specified.

First Preferred Embodiment

Figure 1A:
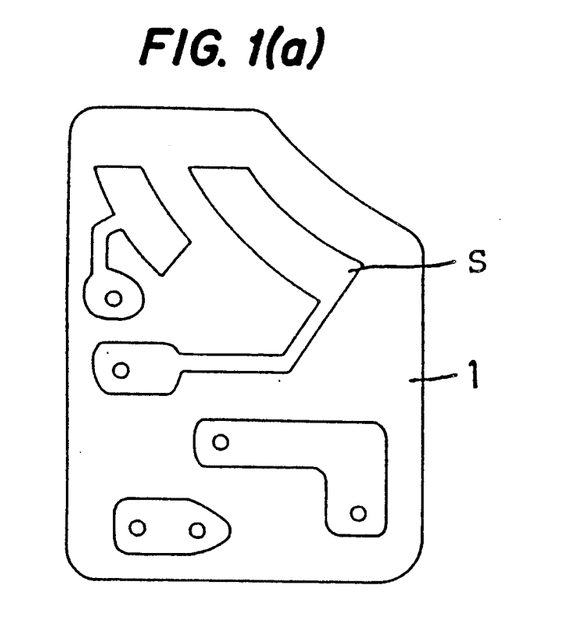
Figure 1B:
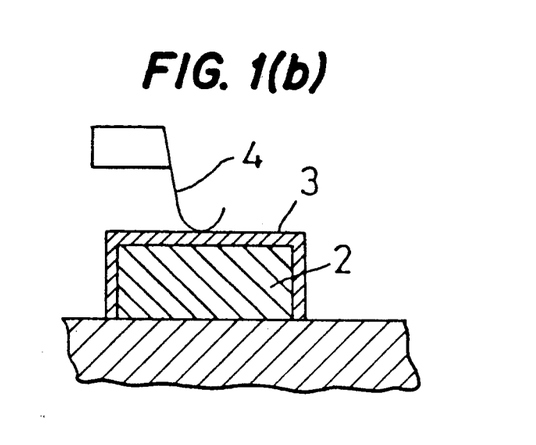

FIG. 1 (a) and FIG. 1 (b) illustrate an electric contact having a sliding poriton "S" to be plated by the first preferred embodiment of a process of nickel plating according to this invention. An electric contact comprises a glass epoxy resin laminated board 1, the sliding portion "S" comprising a copper foil 2 and a plated film 3. FIG. 1 (b) particularly illustrates that a brush 4 made of six-component alloy slides on the sliding portion "S".

Figure 4:
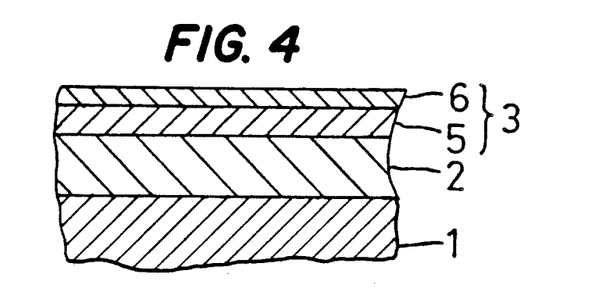
FIG. 4 is a schematic cross sectional view illustrating a plated film formed by a process of nickel plating for forming a plated film having a high phosphorus content according to this invention.

As illustrated in FIG. 1 (b) and FIG. 4, the plated film 3 having a high phosphorus content and comprising an electroless plated film 5 and an electroplated film 6 was formed on the copper foil 2 of the glass epoxy laminated board 1 (CEM3) in accordance with the first preferred embodiment according to this invention. A pattern of a predetermined shape had been previously formed on the glass epoxy resin laminated board 1 by etching, and the thickness of the copper foil 2 was 35 $\mu$m.

As a pretreatment, the following three (3) steps were performed:

A degreasing step, in which the glass epoxy resin laminated board 1 was immersed in 50 c.c./liter of OPC Clean #91 (produced by Okuno Seiyaku Co., Ltd.) at 30° C for two (2) minutes. OPC Clean #91 was diluted with ion-exchanged water.

A soft etching step, in which the glass epoxy resin laminated board 1 was immersed in 100 grams/liter of sodium persulfate ($Na_2S_2O_8$) at 30° C for two (2) minutes. Sodium persulfate was diluted with ion-exchanged water.

An acid cleaning step, in which the glass epoxy resin laminated board 1 was immersed in 100 c.c./liter of sulfuric acid at 30° C for one (1) minute. Sulfuric acid was diluted with ion-exchanged water.

Then, an electroless plating bath capable of forming an electroless plated film having a high phosphorus content was prepared in accordance with Japanese Unexamined Patent Publication (KOKAI) No. 248882/1985. The electroless plating bath comprised the following components:

20 grams/liter of nickel chloride;
100 grams/liter of sodium hypophosphite;
50 grams/liter of trisodium citrate;
2 grams/liter of sodium saccharin;
25 grams/liter of lithium sulfate; and
3 grams/liter of trisodium N-(2-hydroxyethyl)ethylenediamine-N, N', N'-triacetate ($C_{10}H_{15}N_2Na_3O_7$). The electroless plating bath was kept at 90° C, and the pH thereof was controlled at 4.6.

Figure 2A:
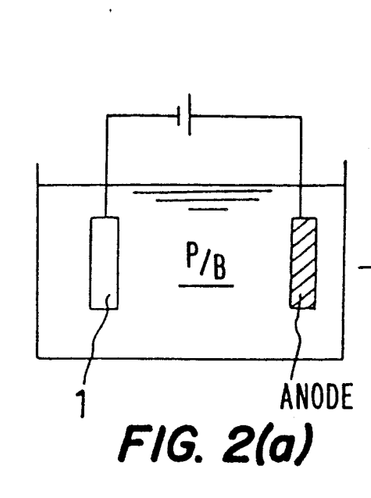
Figure 2B:
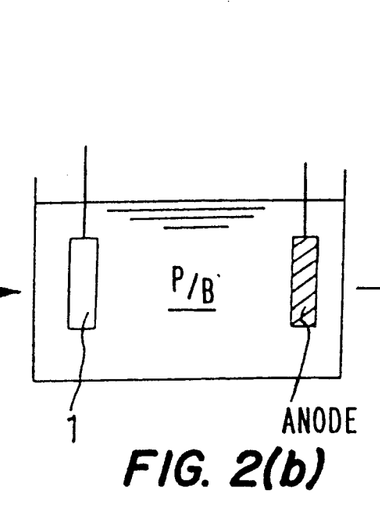
Figure 2C:
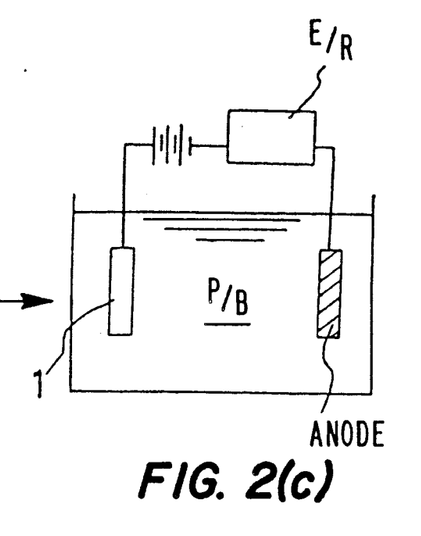

The pretreated glass epoxy resin laminated board 1 was immersed in the electroless plating bath, and subjected to the first preferred embodiment according to this invention. The first preferred embodiment was performed in the order illustrated in FIGS. 2 (a), 2 (b) and 2 (c).

Firstly, the pretreated glass epoxy resin laminated board 1 was immersed in the electroless plating bath "P/B" as illustrated in FIG. 2 (a). One (1) volt of electricity was applied for one (1) minute in this step to start the following electroless plating operation.

Secondly, only an electroless plating is performed on the glass epoxy resin laminated board 1 in the step illustrated in FIG. 2 (b). Under these electroless plating conditions, an electroless plated film of approximately 7 $\mu$m in thickness was formed in 80 minutes. In these steps, an anode comprising a nickel plate was used.

Thirdly, an electroplating is performed on the glass epoxy resin laminated board 1 in the step illustrated in FIG. 2 (c). Namely, the glass epoxy resin laminated board 1 was kept immersed in the electroless plating bath "P/B" even after the above-mentioned elctroless plating. Then, an electric current having the electric current density of 2.5 A/dm² was applied to the electroless plating bath "P/B". An electroplated film of approximately 1.5 $\mu$m in thickness was thus formed on the electroless plated film in five (5) minutes. In this step of electroplating, the glass epoxy resin laminated board 1 was rendered to be a cathode, the nickel plate was rendered to be an anode, and the applied electric current was regulated with an electric current regulator "E/R".

The phosphorus content was found to be 0.1 in atomic ratio of phosphorus with respect to nickel taken as one (1) at the surface of the electroplated film according to the EPMA (electron probe microanalysis) conducted thereafter.

Figure 3:
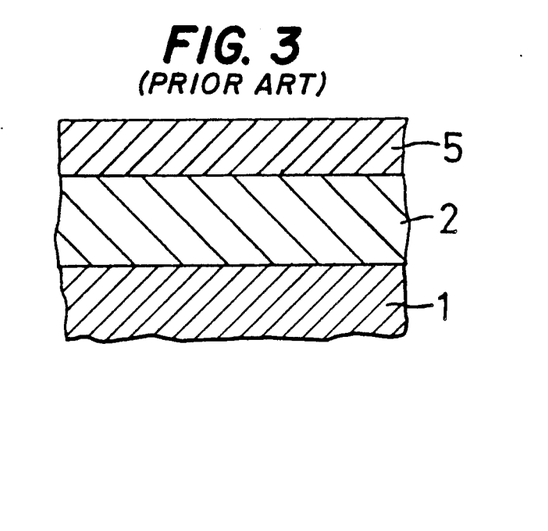
FIG. 3 is a schematic cross sectional view illustrating a plated film formed by a conventional process of electroless nickel plating for forming an electroless plated film having a high phosphorus content.
Figure 5:
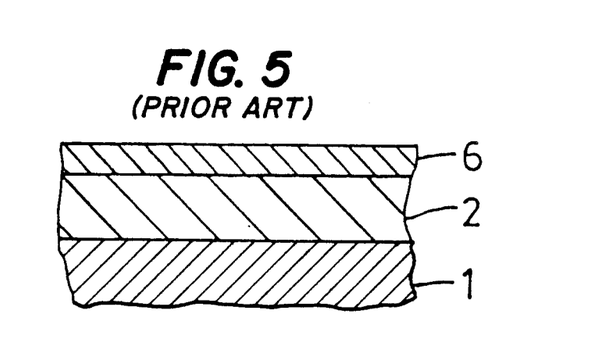
FIG. 5 is a schematic cross sectional view illustrating a plated film formed by a conventional process of nickel electroplating for forming an electroplated film.

FIGS. 3, 4 and 5 illustrate cross sectional views of nickel plated films formed by a first comparative example, the first preferred embodiment according to this invention and a second comparative example, respectively. In FIGS. 3 to 5, the glass epoxy resin laminated board is designated at 1, the copper foil is designated at 2, the electroless plated film is designated at 5, and the electroplated film is designated at 6.

FIG. 3 illustrates the cross sectional view of a nickel plated film formed by the first comparative example, in which only an electroless plated film 5 having a high phosphorus content was formed.

FIG. 4 illustrates the cross sectional view of the nickel plated film formed by the first preferred embodiment according to this invention. The plated film comprised an electroless plated film 5 having a high phosphorus content and an electroplated film 6 having a low phosphorus content.

FIG. 5 illustrates the cross sectional view of a nickel plated film formed by the second comparative example, in which only an electroplated film 6 was formed by a conventional nickel electroplating.

Each of the above-mentioned nickel plated films were subjected to a solder wettability test, a chemical resistance test and an abrasion resistance test, and the results of these tests are set forth in Table 1.

The solder wettability test was conducted in the following manner: A test piece was coated with resin flux. After drying the resin flux, the test piece was immersed in an eutectic solder bath for 5+/−0.5 seconds. The temperature of the eutectic solder bath was controlled at 230+/−30° C.

The chemical resistance test was conducted in the following manner: A test piece was immersed in 300 grams/liter of ferric chloride solution for one (1) minute. The temperature of the ferric chloride solution was 30° C.

The abrasion resistance test was conducted in the following manner: A test piece was abraded with a brush made of six-component alloy comprising platinum (Pt), gold (Au), palladium (Pd) and the like. The load of nine (9) grams was applied to the test piece, and the brush was slid and reciprocated on the test piece by two million times.

plated film having a high phosphorus content, i.e., the chemical resistance and the abrasion resistance.

Figure 6:
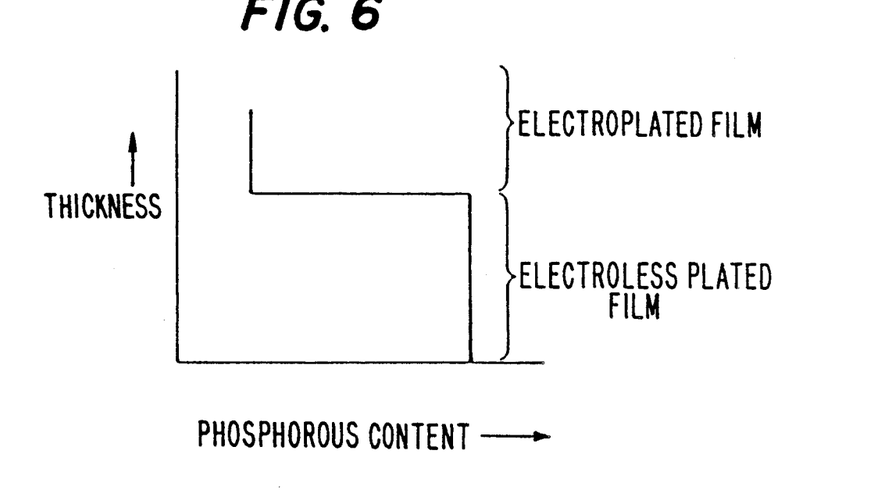
FIG. 6 is a graph showing a relationship between the phosphorus content and the thickness of a plated film formed by a process of nickel plating for forming a plated film having a high phosphorus content according to this invention.

Further, FIG. 6 illustrates the phosphorus content of the electroless plated film and the electroplated film formed by the first preferred embodiment according to this invention. The phosphorus content is plotted with respect to the thickness of the electroless plated film and the electroplated film in FIG. 6. As illustrated in FIG. 6, the phosphorus content was kept high in the electroless plated film, and the phosphorus content was kept low in the electroplated film.

Figure 7:
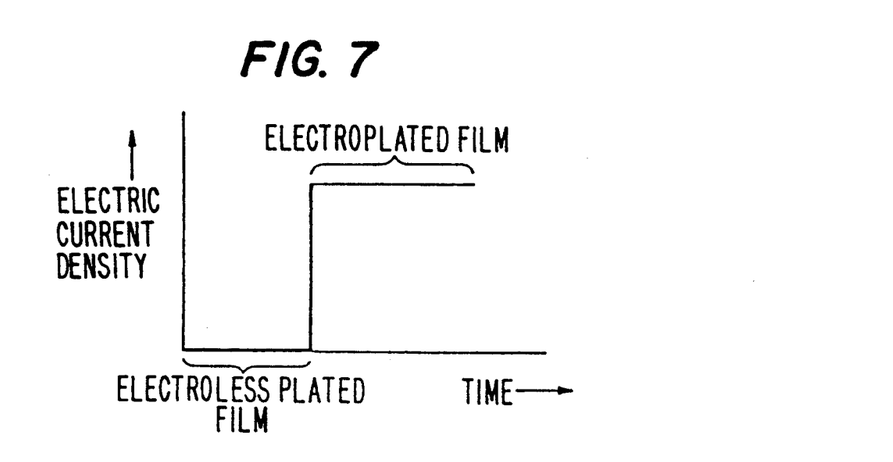
FIG. 7 is a graph showing a relationship between the time and the magnitude of electric current density required for forming a plated film by a process of nickel plating for forming a plated film having a high phosphorus content according to this invention.

FIG. 7 illustrates the variation of the electric current density of the applied electric current in the the first preferred embodiment according to this invention. The electric current density of the applied electric current is plotted with respect to time. As illustrated in FIG. 7, the electroplated film was formed following the forming of the electroless plated film, and no electroplated film was formed until the electric current of a predetermined electric current density had been applied.

Second Preferred Embodiment

After performing the above-mentioned electroless plating as illustrated in FIGS. 2 (b) for 80 minutes, the glass epoxy resin laminated board 1 was kept immersed in the electroless plating bath "P/B" and an electric current was applied to the electroless plating bath "P/B" to perform an electroplating for five (5) minutes. The electric current density of the applied electric current was varied and increased gradually from 0 to 5 A/dm² in five (5) minutes during the step of the electroplating in this second preferred embodiment according to this invention. In other words, the electric current density of the applied electric current was varied in accordance with the line "A" illustrated in FIG. 8. After this electroplating, the glass epoxy resin laminated board 1 was dried to use.

In order to evaluate the plated film, the wettability test, the chemical resistance test and an adhesion test were performed. The wettability test and the chemical resistance test were performed in accordance with the descriptions thereof set forth in the "First Preferred Embodiment" section. The adhesion test was performed as follows:

A test piece including the glass epoxy resin laminated board 1 was bent, and checked with a magnifying glass whether the plated film came off.

A third comparative example was further prepared, in which no electroplating was performed to obtain a

TABLE 1

|  | 1st. Preferred Embodiment (FIG. 4) (2.5 A/dm² for 5 minutes) | 1st. Comparative Example (FIG. 3) | 2nd. Comparative Example (FIG. 5) (2.5 A/dm² for 25 minutes) |
| --- | --- | --- | --- |
| Wetted Area in Percentage | 85 to 95% | 30 to 70% | 85 to 95% |
| Thickness of Plated Film | 8.5 μm | 7.0 μm | 7.5 μm |
| Chemical Resistance | No Coming Off | No Coming Off | Coming Off Occurred |
| Abrasion Resistance | No Base Exposed | No Base Exposed | Base Exposed |
| Evaluation | Good | Fair | Bad |

It is understood from Table 1 that the first preferred embodiment according to this invention can form a plated film having a remarkably improved wettability with respect to solders, and that the first preferred embodiment according to this invention has not impaired the excellent properties of the conventional electroless plated film having only an electroless plated film. The plated film formed by the third comparative example was also subjected to the wettability test, the chemical resistance test and the adhesion test. The results of these tests are set forth in Table 2.

TABLE 2

|  | 2nd. Preferred Embodiment (0 to 5 A/dm for 5 minutes) | 3rd. Comparative Example |
|---|---|---|
| Wetted Area in Percentage | 85 to 95% | 30 to 70% |
| Thickness of Plated Film | 8.5 μm | 7.0 μm |
| Chemical Resistance | No Coming Off | No Coming Off |
| Adhesion | No Coming Off | No Coming Off |

It is understood from Table 2 that the second preferred embodiment according to this invention can form a plated film having a remarkably improved wettability with respect to solders, and that the wettability is much more satisfactory than the plated film formed without the electroplating. The plated film formed by the second preferred embodiment according to this invention was found to be applicable to an automated soldering process, and the other physical properties of the plated film, i.e., the chemical resistance and the adhesion, were not impaired at all.

Third Preferred Embodiment

Figure 8:
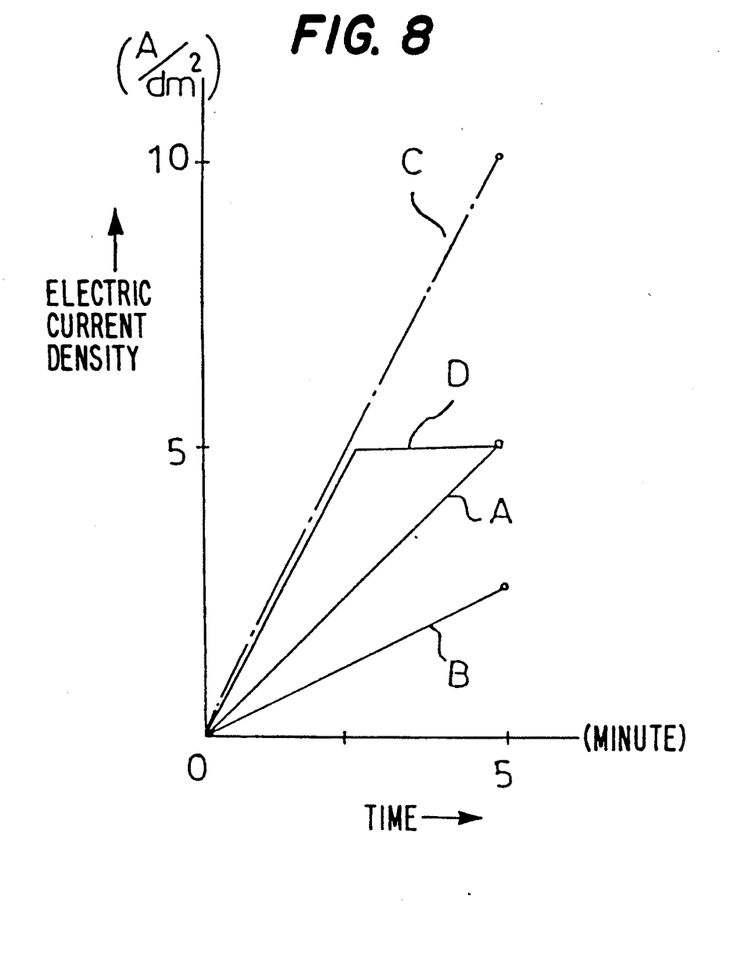
FIG. 8 is a graph showing relationships between the time and the magnitude of electric current density required for forming plated films by preferred embodiments of a process of nickel plating for forming a plated film having a high phosphorus content according to this invention.

In this third preferred embodiment according to this invention, the electric current density of the applied electric current was varied linearly from 0 to 2.5 A/dm$^2$ in accordance with the line "B" illustrated in FIG. 8 in five (5) minutes during the step of the electroplating. Other than the variation of the electric current density, the third preferred embodiment according to this invention was performed in a manner identical with that of the first preferred embodiment according to this invention. A plated film formed by the third preferred embodiment was subjected to the above-mentioned wettability test, chemical resistance test and adhesion test. The results of the tests are set forth in Table 3.

Fourth Preferred Embodiment

In this fourth preferred embodiment according to this invention, the electric current density of the applied electric current was varied linearly from 0 to 10 A/dm$^2$ in accordance with the line "C" illustrated in FIG. 8 in five (5) minutes during the step of the electroplating. Other than the variation of the electric current density, the fourth preferred embodiment according to this invention was performed in a manner identical with that of the first preferred embodiment according to this invention. A plated film formed by the fourth preferred embodiment was subjected to the above-mentioned wettability test, chemical resistance test and adhesion test. The results of the tests are set forth in Table 3.

Fifth Preferred Embodiment

In this fifth preferred embodiment according to this invention, the electric current density of the applied electric current was varied linearly from 0 to 5 A/dm$^2$ in accordance with the line "D" illustrated in FIG. 8 in 2.5 minutes during the step of the electroplating, and the electroplating was further performed for another 2.5 minutes while controlling the electric current density at 5 A/dm$^2$. Other than the variation of the electric current density and the prolonged electroplating at the predetermined electric current density (5 A/dm$^2$), the fifth preferred embodiment according to this invention was performed in a manner identical with that of the first preferred embodiment according to this invention.

A plated film formed by the fifth preferred embodiment was subjected to the above-mentioned wettability test, chemical resistance test and adhesion test. The results of the tests are set forth in Table 3.

TABLE 3

|  | 3rd. Preferred Embodiment | 4th. Preferred Embodiment | 5th. Preferred Embodiment |
|---|---|---|---|
| Wetted Area in Percentage | 70 to 80% | 85 to 90% | 85 to 95% |
| Thickness of Plated Film | 7.5 μm | 9.5 μm | 9.0 μm |
| Chemical Resistance | No Coming Off | No Coming Off | No Coming Off |
| Adhesion | No Coming Off | No Coming Off | No Coming Off |

The following are understood from Table 3: Although the plated film formed by the third preferred embodiment exhibited a bit poor wettability compared with the wettability of the plated films formed by the fourth and fifth preferred embodiment, even the plated film formed by the third preferred embodiment exhibited a better wettability than the wettability of the third comparative example set forth in Table 2. The other physical properties, i.e., the chemical resistance and the adhesion, of the plated films formed by the third, fourth and fifth preferred embodiment are satisfactory.

Further, the phosphorus contents of the plated films formed by the third, fourth and fifth preferred embodiment and the third comparative example were measured by the EPMA. The results of the measurements are set forth in Table 4. The phosphorus contents are expressed in the atomic ratio of phosphorus with respect to nickel taken as one (1) in Table 4.

TABLE 4

|  | 2nd. Pref. Embodi. | 3rd. Pref. Embodi. | 4th. Pref. Embodi. | 5th. Pref. Embodi. | 3rd. Com. Example |
|---|---|---|---|---|---|
| Phosphorus Content | 0.13 | 0.17 | 0.18 | 0.10 | 0.22 |

Figure 9:
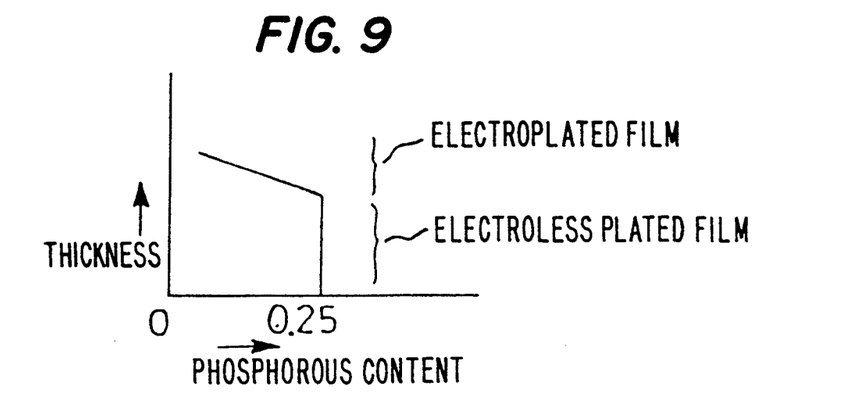
FIG. 9 is a graph showing a relationship between the phosphorus content and the thickness of a plated film formed by a process of nickel plating for forming plated film having a high phosphorus content according to this invention.

Taking the measurement errors and the phosphorus content distribution in the thickness-wise direction into account, it is understood from Table 4 that phosphorus was contained less in the electroplated film as the electric current density was increased and as the electroplating time was prolonged. Moreover, it is readily realized that the electroplated films formed by the second, third, fourth and fifth preferred embodiment had the decreasing phosphorus contents in the thickness-wise direction of the electroplated film as illustrated in FIG. 9.

Having now fully described the invention, it will be apparent to one of ordinary skill in the art that many changes and modifications can be made thereto without departing from the spirit or scope of the invention as set forth herein.

What is claimed is:
1. A nickel plated film comprising:
   a first plated film formed on a substance to be plated and having a phosphorus content of from 0.20 to 0.25 in atomic ratio of phosphorus with respect to nickel taken as one (1); and
   a second plated film formed on said first plated film and having a phosphorus content less than that of said first plated film, wherein said second plated film comprises portions having phosphorus contents continuously varying from the highest value at the boundary between said first plated film and said second plated film to the lowest value at the surface of said second plated film.

2. The nickel plated film according to claim 1, wherein the thickness of said first plated film is at least 7.0 μm, and the thickness of said second plated film is at least 0.5 μm.

3. The nickel plated film according to claim 1, wherein said first plated film is an electroless plated film and said second plated film is an electroplated film.

* * * * *